(12) United States Patent
Perlov et al.

(10) Patent No.: US 7,304,364 B2
(45) Date of Patent: Dec. 4, 2007

(54) EMBOSSED MASK LITHOGRAPHY

(75) Inventors: Craig Perlov, San Mateo, CA (US);
Carl Taussig, Woodside, CA (US);
Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 571 days.

(21) Appl. No.: 10/885,842

(22) Filed: Jul. 6, 2004

(65) Prior Publication Data

US 2004/0256352 A1    Dec. 23, 2004

Related U.S. Application Data

(62) Division of application No. 10/244,862, filed on Sep. 17, 2002, now Pat. No. 6,887,792.

(51) Int. Cl.
*H01L 29/00* (2006.01)
*G11C 11/34* (2006.01)

(52) U.S. Cl. .............................. 257/499; 257/E27.026; 365/174

(58) Field of Classification Search ................ 257/499, 257/E27.026

See application file for complete search history.

(56) References Cited

U.S. PATENT DOCUMENTS

| 6,646,912 | B2 * | 11/2003 | Hurst et al. ................. 365/175 |
| 2002/0184459 | A1 * | 12/2002 | Taussig et al. .............. 711/165 |
| 2002/0192895 | A1 * | 12/2002 | Taussig et al. .............. 438/237 |
| 2004/0053497 | A1 * | 3/2004 | Perlov et al. ............... 438/684 |

* cited by examiner

*Primary Examiner*—Lex Malsawma

(57) ABSTRACT

Disclosed are layered groupings and methods for constructing digital circuitry, such as memory known as Permanent Inexpensive Rugged Memory (PIRM) cross point arrays which can be produced on flexible substrates by patterning and curing through the use of a transparent embossing tool.

7 Claims, 7 Drawing Sheets

EMBOSSED MASK LITHOGRAPHY

This application is divisional of application Ser. No. 10/244,862, filed Sep. 17, 2002, now U.S. Pat. No. 6,887,792.

FIELD OF THE INVENTION

The present invention relates to the field of the production of integrated circuitry used in digital memory circuits suitable for high-density, high-capacity, low cost data storage. In particular, the invention further relates to the provision of mass produced cross point memory arrays which are fabricated as multiple layered groupings on a flexible substrate according to an embossing method which patterns the thin films which comprise the multiple layered groupings. Rather than being situated on a rigid wafer or spun on like a photo resist, the inventive arrays are roll coated on flexible substrates. This inventive approach results in the ability to mass produce memory arrays cheaply for use in digital memory systems, such as the Permanent Inexpensive, Rugged Memory (PIRM) cross point arrays which can be utilized in consumer devices and other electronic devices.

BACKGROUND OF THE INVENTION

Many consumer devices such as digital cameras (still and/or moving picture), digital music players/recorders (e.g. MP3 players), personal digital assistants (PDAs), mobile telephones, and the like are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. As such, present digital consumer devices require specialized storage memory to accommodate the large quantities of digital data.

To provide for this type of data storage application, storage memory should be: (1) relatively low in cost for sufficient capacities of around 10 MB to 1 gigabyte (GB); (2) low in power consumption (e.g. <<1 Watt); (3) have relatively rugged physical characteristics to cope with the portable battery powered operating environment; (4) and should preferably have a short access time (ideally less than one millisecond) and moderate transfer rate (e.g. 20 Mb/s), yet be able to be packaged in an industry standard interface module, such as PCMCIA or Compact Flash card. The limitations of the current industry standard FLASH memory, such as high cost and relatively low capacity for broad utilization in the above described applications, are well known, and as such, recent advances have provided for a type of memory module termed "PIRM" (Portable Inexpensive Rugged Memory), which addresses the problem of low cost archival storage for digital camera and other portable appliances. The benefits of PIRM memory comport with the needs of high capacity memory in consumer devices above (e.g., an industry standard interface such as PCMCIA or Compact Flash, 2000 G shock tolerance, low power consumption (<<1 W), short access time ( <1 ms), moderate transfer rate (20 Mb/s), and sufficient capacity (10 MB-1 GB)). In addition, PIRM memory modules can offer lower cost by avoiding silicon substrates, by lowering areal density, and by minimizing process complexity.

However, production of PIRM memory modules can be problematic because popular consumer devices are requiring ever increasing amounts of such memory, and current production methods can be very expensive. This brings about the need for such exacting types of memory arrays to be produced on a mass scale in order to reduce costs.

Attempts have been made for such mass scale production by the patterning of thin films of metals and semiconductor on flexible plastic webs in a roll-to-roll production environment. However, plastic web production is currently plagued by deficiencies inherent in the actual patterning methods utilized on flexible substrates. Specifically, existing patterning solutions, such as screen print and ink jet, photolithography, and laser ablation each have deficits in resolution and/or throughput, and can also cause collateral damage. In particular, screen print or inkjet based patterning schemes yield a relatively low throughput and limited ability to pattern a wide range of materials that can be deposited. Photolithography, laser ablation, or other optically based patterning methods yield a relatively low throughput, higher capital cost, and low resolution. This is because the resolution of such optically based schemes is limited by diffraction in proportion to $$\frac{\lambda}{NA},$$

where $\lambda$ is the wavelength of the illumination and NA is the numerical aperture of the imaging system. Given that the depth of field for the imaging system, and hence its ability to deal with surface irregularities is limited by $$\frac{\lambda}{NA^2},$$

at some point it becomes very difficult to resolve small features on a flexible substrate with such methodologies. This is because it is difficult to clamp a flexible substrate with a vacuum or electrostatic chuck without introducing surface irregularities, especially given the surface roughness typical of flexible webs.

Emboss and liftoff techniques can provide a low cost patterning method having a comparatively high resolution and high throughput when used on flexible substrates. However, several problems do limit its utility for producing electronics. One such limitation relates to the patterning of a multilayer deposition. The second such problem has to do with the performing of a second deposition/patterning step on top of a set of previously patterned films, as this process flow works well for a single homogeneous deposition, but not necessarily for heterogeneous depositions where multiple thin films are deposited in series and then co-patterned, because the sidewall coverage may produce shunts in the patterned features.

In an attempt to overcome such shortcomings, recent advances have been able to produce multiple layers, but even these advances are limited in that the developed processes are restricted to the usage of depositions which are spun on the rigid wafer substrate with the use of a photo resist, thereby relegating the process to less economical means which are limited in mass production potential.

Accordingly, prior art methodologies have been limited to the usage of the other previously described patterning methods, without consideration of the usage of embossing when patterning multiple films on flexible substrates.

As such, in order to adequately provide for digital circuitry such as PIRM memory modules, there is a need for the mass production, high definition, and the economies of scale which result from the utilization of the embossing process on flexible web sheet substrates when producing the required quantities amounts of cross point arrays and other types of related integrated circuitry.

SUMMARY OF THE INVENTION

In accordance with the principles of the present invention, multiple layers embossed, cured and etched on a flexible substrate are provided for use in PIRM cross-point memory arrays. The cross point arrays are produced in a plastic web based roll to roll environment, according to an improved embossed lithography technique which provides the required high definition and throughput, yet overcomes the typical limitations of the prior art patterning techniques. Moreover, the process complexity of such digital circuitry can be significantly lowered by the use of the inventive embossed lithography as a patterning method used on flexible substrates.

The inventive embossing, when compared to the prior art patterning methods for both rigid and flexible substrates, yields a relatively high throughput, offers an ability to pattern a wider range of materials, and provides greater resolutions. The present invention has the various advantages of higher throughput, lower capital cost, and greater resolution when specifically compared other patterning methods. In particular, the inventive throughput is higher than say, prior art optical schemes, because the entire width of a given plastic web is embossed at once, which is in contrast to the inherent limitation within optical schemes where the source must be scanned in some manner with respect to the substrate. With regard to say, prior art excimer laser systems, the capital costs of the inventive embossing system is much lower than excimer laser systems, and also avoids the potential for collateral damage by the thermal effects of excimer lasers, as well as the drawbacks which the excimer lasers have, much like the optical systems, such as the need to be scanned, sensitivity to z-height, etc. The inventive mass embossing lithography also overcomes the limitations of prior art embossing techniques related to the patterning multiple films and the stacking of groupings on a substrate. In particular, the invention overcomes the different limitations of the various prior art patterning methods for both flexible and rigid substrates, and the shortcomings of the prior art embossing for production of cross point memory arrays by introducing the concept of being able to roll coat multiple layers on a flexible, rather than rigid substrate. These layers are processed, in one embodiment, through the utilization of a transparent embossing tool for embossing and curing, where the curing may be done from the backside of the embossing tool, which directs UV light onto a UV-curable photopolymer. Dry etching processes, such as antistrophic etching, may be further employed as described herein. One form of the invention provides for the producing of row and column electrodes for integrated circuitry such as used in cross point memory arrays, terminating pads, etc.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

Circuitry such as cross-point memory arrays and other applications, like PIRM digital memory system which can be mass produced efficiently on a plastic web in a roll to roll environment, according to an improved embossed mass lithography disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

Circuitry of Digital Memory Systems

Typical Digital Memory Systems such as PIRM memory module are formed of a plurality of layers each having a cross-point memory array. Many layers can be stacked to form a single memory module, allowing the memory module to have a storage capacity of many multiples of the data storage possible on a single layer. Construction of a PIRM memory module therefore involves the stacking of multiple layers of memory into an interconnected three-dimensional storage module via other circuitry such as conductive pads. U.S. patent application Ser. No. 09/875.356. now Pat. No. 6,646,912 details the technology involved in providing the improved stackable circuitry in PIRM memory modules as referenced throughout, while U.S. patent application Ser. No. 09/875,833 details the generally referenced PIRM based digital memory systems for consumer devices, and U.S. patent application Ser. No. 10/245,897 details the type of circuitry used for conductive pads which connect layers within PIRM based digital memory. The disclosures of these documents are explicitly incorporated herein by reference.

Cross point memory arrays in stackable circuitry, conductive pads and the like can be mass produced according to the simple and inexpensive processing which utilizes a flexible plastic or metal substrate in roll to roll processing. While the inventive embossed mass lithography techniques may be utilized for all manner of digital memory circuitry, the details described herein are especially suited for the embodiment of forming cross point arrays within the aforementioned digital memory systems, and the discussions hereafter shall refer specifically to producing the circuits for cross point array memory.

Embossed Mask Lithography of Cross Point Arrays

Figure 1:
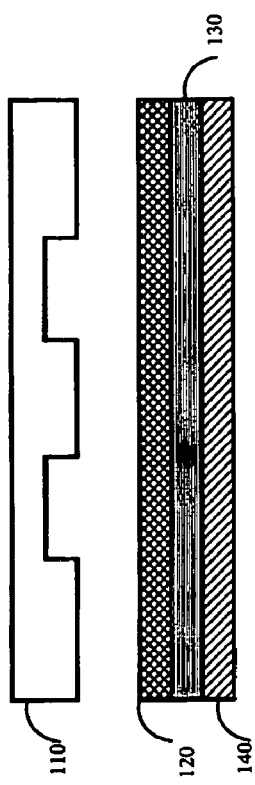
FIG. 1 is a cross sectional view of a grouping of layers comprising multiple thin films having been deposited in series on a flexible substrate in relation to the transparent embossing tool before embossing.

According to one embodiment, the inventive cross point arrays will be formed from the combination of at least a primary and a secondary grouping of patterned layers. The structure of a given grouping may be illustrated in the (primary) sample grouping shown in FIG. 1. FIG. 1 shows an exemplary grouping of patterned layers just prior to commencement of the inventive embossed mask lithography. In one embodiment, a grouping of patterned layers may comprise at least one thin film 130 for patterning, which is, in one embodiment, formed on a plastic (polymer) substrate 140. Although it is not essential that a polymer material be used as a substrate, this is preferred because the materials can be produced and processed at relatively low cost. The substrate 140 may be formed from a variety of commercially available flexible substrates (such as polymer materials or other flexible materials), all of which are preferably in the form of a sheet material. The substrate is preferably thin to permit flexible "roll-to-roll" processing, such as of the order of 0.01 mm to 0.05 mm in thickness. Thin film depositions for thin film 130 may comprise one or more layers of metals, semiconductors and dielectrics. There are many different materials that may be used for the semiconductor layer of the memory circuits, such as organic and inorganic materials, with inorganic semiconductor materials being preferred, because of their environmental stability and maturity of technology. In one embodiment, an exemplary layering may take the form of: Metal/I-A-Si/P$^+$ microcrystalline silicon/ I-A-Si/N$^+$ microcrystalline silicon /metal. For greater specificity regarding the substrate and thin film compositions as well as the deposition processing, reference may be made to the aforementioned incorporated patent applications. Of course, other materials may also be employed for the purposes of the present invention, as will be apparent to those skilled in the art.

Applied on top of thin film 130 is embossing layer 120. This layer may be an uncured layer of UV curable resin, or a thermoplastic resin heated above its $T_g$, or a chemically softened plastic, or other liquid based materials and solids applied at high temperatures. In one preferred embodiment, embossing layer 120 will comprise a photopolymer, such as a UV curable resin coated on thin film 130.

Thereafter, several approaches might be made to the patterning of a given grouping. In one embodiment, a modification of the emboss and lift off technique as described in the above referenced and U.S. patent application entitled "Large Line Conductive Pads for Interconnection of Stackable Circuitry" may be used for utilizing an adhesive for peeling off the embossed layers as needed. However, in a preferred embodiment described herein, the grouping of patterned layers will be processed according to the following description of the inventive embossed mass lithography technique which utilizes anisotropic etching and a transparent embossing tool for embossing and curing with UV light.

Figure 2:
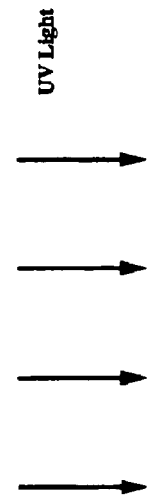
FIG. 2 is a cross sectional view of the grouping of patterned layers comprising multiple thin films on the flexible substrate while the transparent, UV emitting embossing tool is embossing along trenches and curing the embossing layer.
Figure 2:
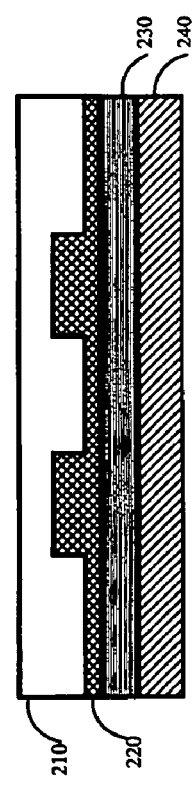

The inventive process thereafter begins with the embossing of the embossing layer with a pattern of micron or sub-micron scale features. The embossing is performed by a stamper or embossing tool 110 which is part of a roll (not depicted), which has had features, defined on its surface. In its softened, liquid state, very little of the undesirable deforming pressure is exhibited on the substrate and thin film layers when embossing layer 120 is embossed by the embossing tool in a roll-to-roll process. Typically, the embossing tool is fixed to one roller that is held a fixed distance from a second roller. The coated substrate is fed between the rollers with the softened plastic being impressed with the topological features of the embossing tool as the web passes through the nib between the rollers. The stamper or embossing tool 110 may be formed from a UV transparent material such as PDMS (poly dimethyl siloxane). Provision of embossing tool 110 as a transparent structure means that the embossing layer 120 may, instead of just being generally exposed to a curing light energy, can be embossed and then precisely exposed according to the pattern through the transparency of the embossing tool 110. Preferably, such curing will occur while the embossing tool 110 is fully engaged with the embossing layer 120 so as to minimize the precision of the exposure and so as to permit the embossing tool 110 to cleanly withdraw from the embossed embossing layer 120. In one embodiment, the light energy will be a UV light source which is directed substantially from behind the embossing tool as pictured in FIG. 2. Hence, after embossing, a pattern will be formed in relief in the embossed embossing layer 120 on top of the thin films as shown in FIG. 2 where at least a portion of the embossed embossing layer 120 can be cured precisely in order to form the desired topography and so as to permit the embossing tool 110 to cleanly withdraw from the embossed embossing layer 120.

Figure 3:
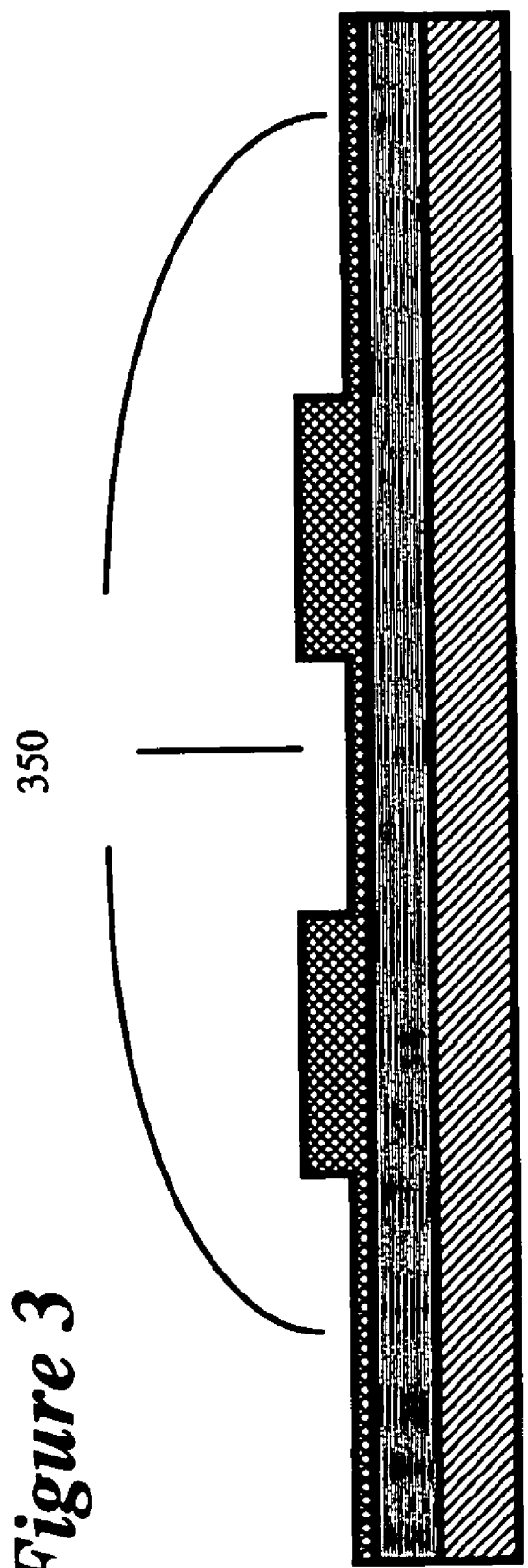
FIG. 3 is a cross sectional view of the grouping of patterned layers comprising multiple thin films on the flexible substrate after the transparent, UV emitting embossing tool has embossed trenches and cured the embossing layer, thereby leaving a residual layer.
Figure 4:
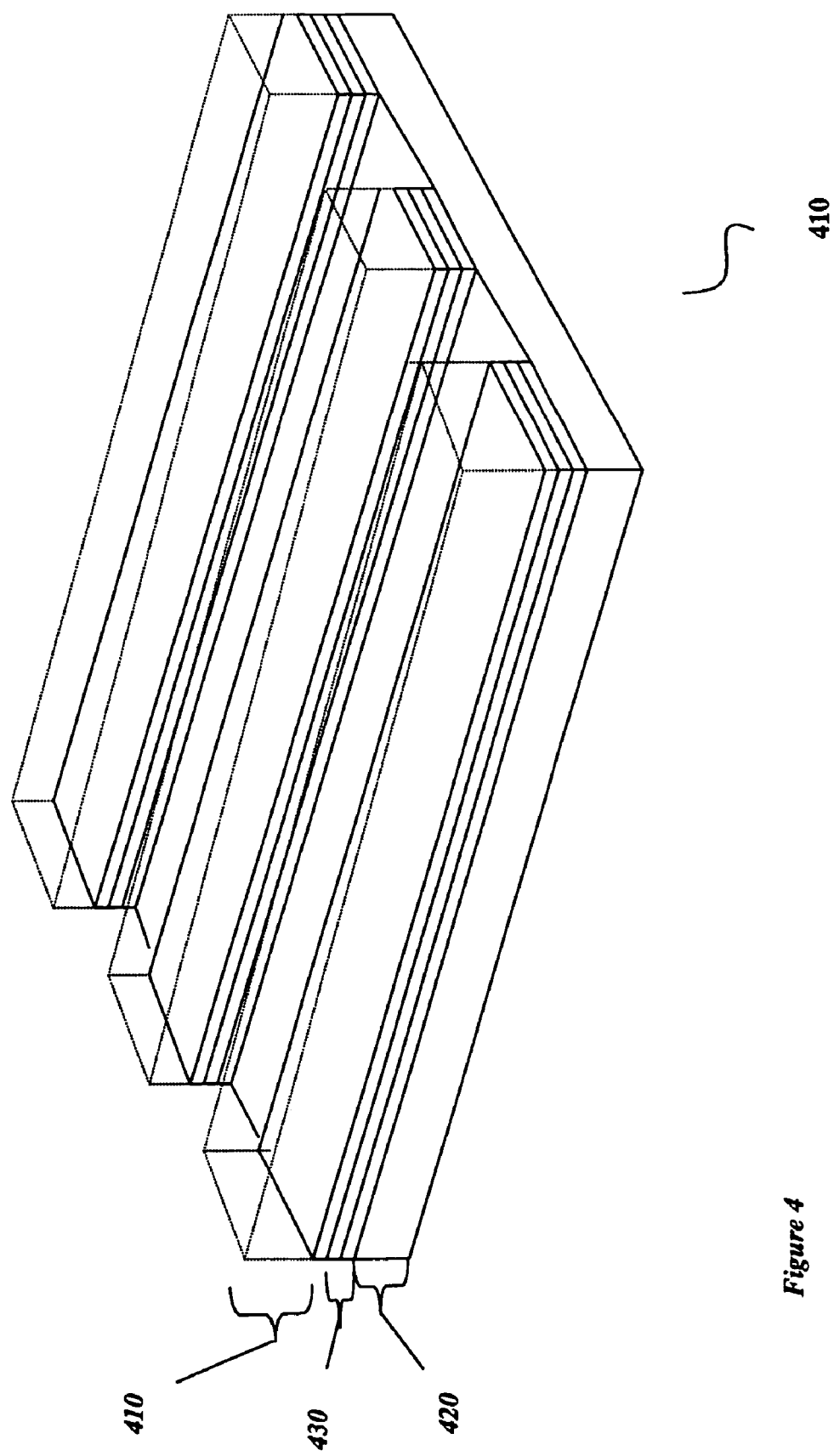
FIG. 4 is a 3-D view of the result of the etching of the embossed and cured grouping of patterned layers, wherein the selective etching step of the inventive process etches the residual embossed and film layers down to the substrate in the embossed trench areas.

Thusly patterned and cured, FIG. 3 depicts how a thin layer of embossed and cured embossing layer 120 will still remain at the bottom of the trenches or groove(s) 350. The resulting topography of the embossed and cured embossing layer 120 will have a crenellated side profile with peaks (high points), and trenches (low points) as measured in respect to the respective depths from their extreme points to the underlying thin film layer 130. In preferred embodiments, the peaks and trenches will have certain a ratio between these respective depths. Specifically, the depth of the higher points of the embossed embossing layer 120 to the depth of the residual embossed embossing layer in the trenches 350 will be in the range of 3 to 5 times higher, and in one preferred embodiment, will be approximately 3:1. This type of disparity in relative depths will function as a mask for promoting the patterned embossed layer 120 to be utilized in an etching process which can etch out the portions of the thin film layer 130 only along the trenches or groove(s) 350. Depending on the exact materials used in the layered grouping, this process would ideally be a type of dry etching process, preferably an anisotropic etch such as reactive ion etching, so that lateral feature definition of the peaks and trenches will be preserved. At the end of the etching process, the grouping of patterned films will appear as in FIG. 4.

Figure 5:
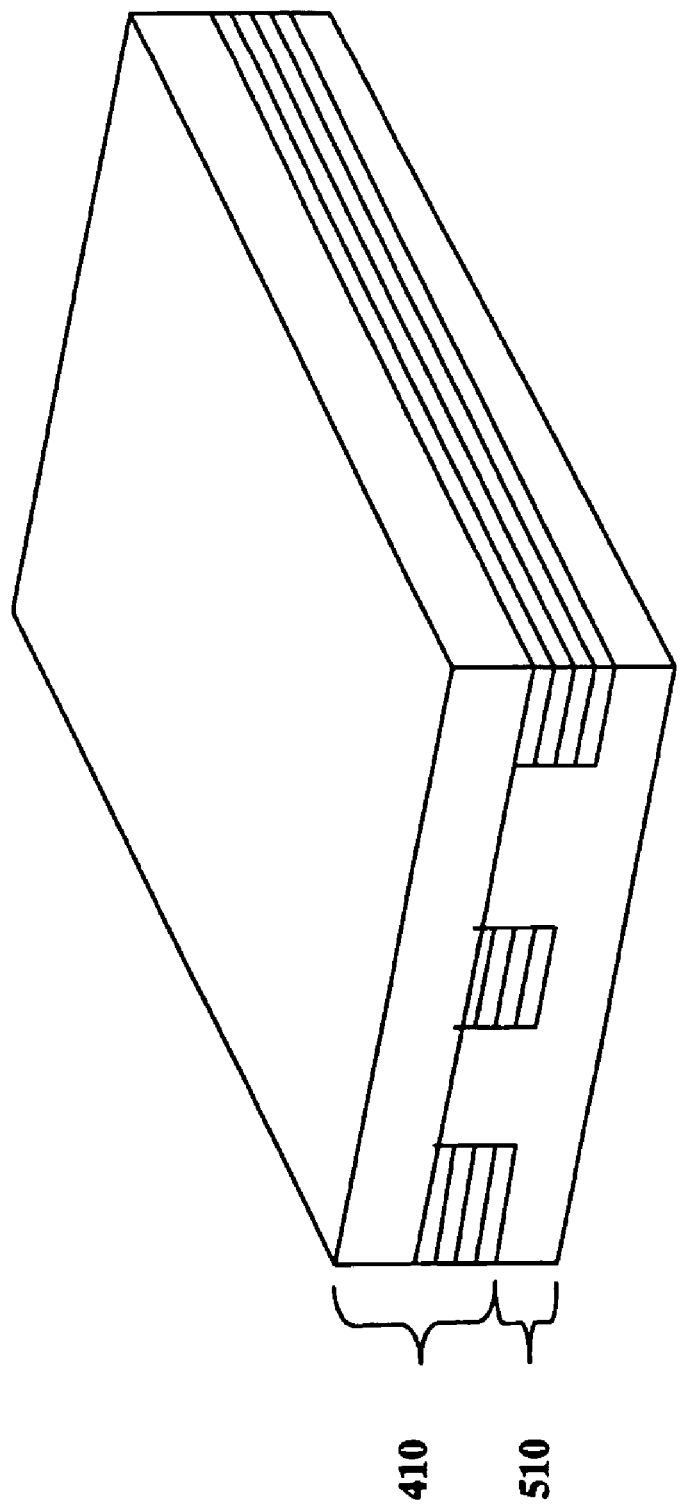
FIG. 5 is a 3-D view of the transfer (adhesive) layer underneath the embossed and cured grouping of patterned layers in the present invention.
Figure 6:
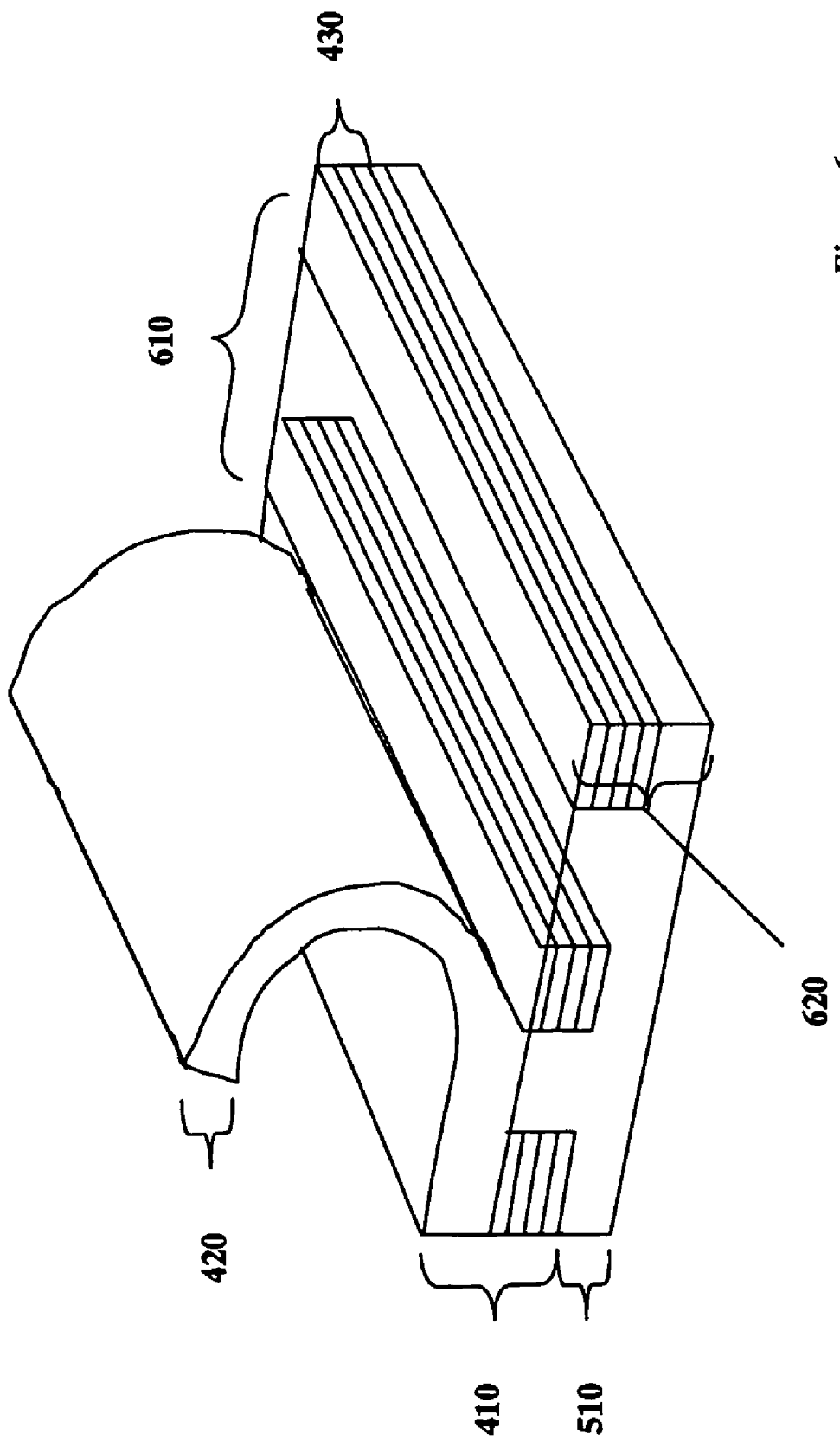
FIG. 6 is a 3-D view of the inversion of the transfer (adhesive) layer on top of embossed and cured grouping of patterned layers in the present invention, and the peeling away of the original substrate upon which the patterned layers were originally applied, thereby leaving a substantially planar surface with the patterned layers embedded in the transfer layer.

Next, as depicted in FIG. 5, a transfer polymer 510 is applied to the primary patterned films 410 which are situated on original substrate 420. The application of polymer 510 serves two functions. One is to fill in the etched trenches, providing a planar interface on substrate 420. Another function is to provide support to the etched structure for later lift-off. Then, as seen in FIG. 6, the primary grouping is inverted and a mechanical lift off process is employed whereby the original substrate 420 (upon which the primary grouping 410 was applied) is lifted off so as to reveal an exposed, substantially planar surface 610. This transposes the original order of the primary patterned films 410, and provides for the subsequent application and embossing of another grouping of patterned layers to be facilitated by starting on an initially planar surface.

Figure 7:
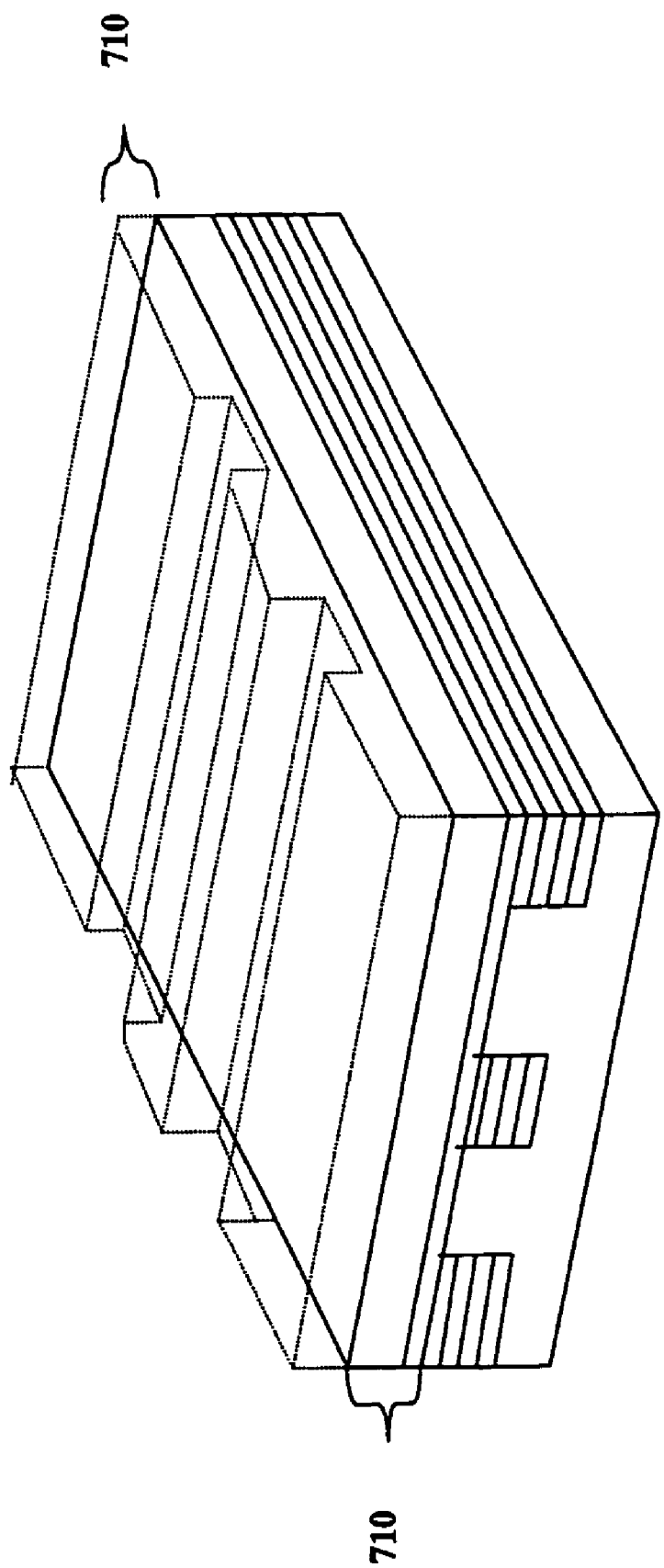
FIG. 7 is a 3-D view of the application of a secondary grouping of patterned layers on top of the (originally) bottom surface of the primary grouping of patterned layers and transfer polymer according to the present invention.
Figure 8:
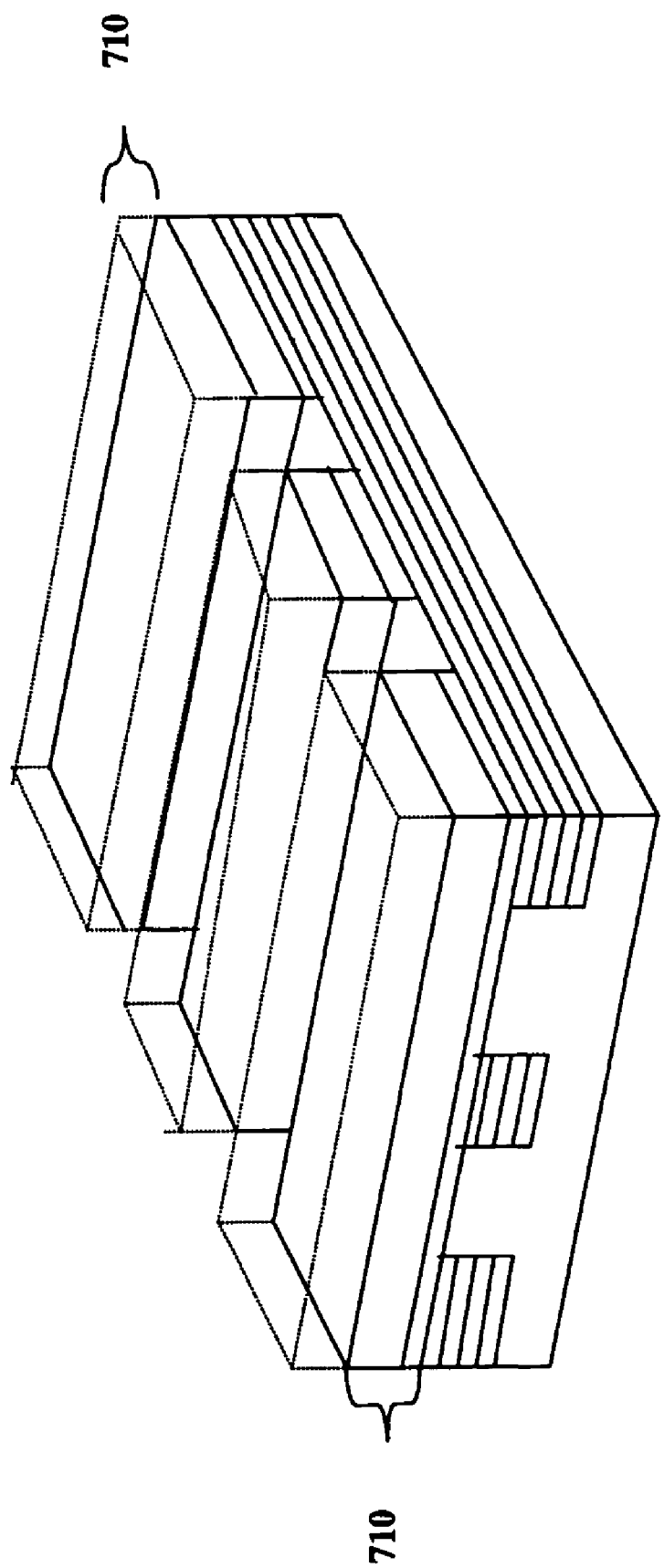
FIG. 8 is a 3-D view of the result of using the embossed material as an etch mask for patterning the underlying thin film stack or secondary grouping of layers in a substantially parallel fashion to the patterning of the primary grouping of layers according to the present invention.

The next process step is the deposition of a secondary grouping of patterned layers, which, like the primary grouping, may consist of one or more layers of metals, semiconductors, and dielectrics, and is performed similar to that described above. The secondary grouping of patterned thin layers may thereafter be constructed according to the specifics described above with regard to the primary grouping of patterned thin layers. Thusly constructed, the secondary grouping of the thin layers may then be applied, embossed and etched as previously described. In doing so, a secondary grouping of patterned thin layers may be embossed and etched so as to provide for a substantially orthogonal juxtaposition of the secondary grouping of patterned thin layers on top of the primary grouping of patterned thin layers (FIG. 7). Provision as such yields substantially orthogonally juxtaposed row and column layers of electrodes which may be used for any of the above mentioned circuitry applications. When the groupings are processed in accordance with the above-described details, circuitry such as cross point array memories may be formed in a variety of ways. In one preferred embodiment, the structuring may take the generalized form of a metal deposition on top, a metal deposition on the bottom, with a diode and switch in between, as known in the art of forming such memory arrays. In any specific embodiment, however, the above mentioned selective etching will ensure that the etching process will stop within the secondary grouping, and will not invade the primary grouping, as seen in FIG. 8. Nevertheless, higher structural aspect ratios may be needed between the trenches and peaks in order to accommodate any potential discrepancies in planarity in such processing.

The foregoing detailed description of a preferred embodiment of the present invention is presented by way of example only, and many variations to the circuits, structures, arrangements and processes described are possible without departing from the scope of the invention. The principles of the present invention can be applied with many other variations to the circuits, structures, arrangements and processes described herein, as will be apparent to those of ordinary skill in the art, without departing from the scope of the invention as defined in the appended claims.

We claim:

1. A digital data circuitry system comprising:
a memory module having digital circuitry having a plurality of formed portions, at least one of said formed portions having at least a first and a second groupings of embossed layers adjacent to a planar surface, said first and second groupings of embossed layers being formed with respective substantially linear trenches and peaks which are in substantially orthogonal juxtaposition to each other on opposite sides of said planar surface.

2. The digital data circuitry system as claimed in claim 1, wherein said respective substantially linear trenches and peaks of said first and second groupings of embossed layers are formed on a flexible substrate and mask etched through the use of anisotropic etching.

3. The digital data circuitry system as claimed in claim 1, wherein said forming of said first and second groupings of embossed layers on a flexible substrate is accomplished through the use of UV curing.

4. The digital data circuitry system as claimed in claim 1, wherein said first and second groupings are embossed using at least one stamper substantially formed from at least one material from a group comprising UV curable silicone rubbers.

5. The digital data circuitry system as claimed in claim 1, wherein said first and second groupings are embossed using at least one stamper substantially formed from poly dimethyl siloxane (PDMS).

6. The digital data circuitry system as claimed in claim 1, wherein said respective substantially linear trenches and peaks of said first and second groupings of embossed layers are formed on a flexible substrate and mask etched through the use of reactive ion etching.

7. The digital data circuitry system as claimed in claim 1, wherein said first and second groupings further comprise at least one thin film formed from at least one material from a group of materials comprising metals, dielectrics, and semiconductors.

* * * * *